United States Patent
Jin

(10) Patent No.: US 10,134,913 B2
(45) Date of Patent: Nov. 20, 2018

(54) METHOD OF MANUFACTURING AMORPHOUS IGZO TFT-BASED TRANSIENT SEMICONDUCTOR

(71) Applicant: INCHEON UNIVERSITY INDUSTRY ACADEMIC COOPERATION FOUNDATION, Incheon (KR)

(72) Inventor: Sung-Hun Jin, Gyeonggi-do (KR)

(73) Assignee: INCHEON UNIVERSITY INDUSTRY ACADEMIC COOPERATION FOUNDATION, Incheon (KR)

( * ) Notice: Subject to any disclaimer, the term of this patent is extended or adjusted under 35 U.S.C. 154(b) by 0 days.

(21) Appl. No.: 15/133,930

(22) Filed: Apr. 20, 2016

(65) Prior Publication Data

US 2016/0315200 A1   Oct. 27, 2016

(30) Foreign Application Priority Data

Apr. 21, 2015   (KR) .................. 10-2015-0056186

(51) Int. Cl.
*H01L 29/00*   (2006.01)
*H01L 29/786*   (2006.01)
(Continued)

(52) U.S. Cl.
CPC ...... *H01L 29/78693* (2013.01); *H01L 27/127* (2013.01); *H01L 27/1225* (2013.01);
(Continued)

(58) Field of Classification Search
CPC .................. H01L 27/1225; H01L 27/127
(Continued)

(56) References Cited

U.S. PATENT DOCUMENTS 3,891,483 A * 6/1975 Messerschmidt ....... H01L 21/00
  252/79.3
6,328,785 B1 * 12/2001 Hayashi ............. B01D 19/0021
  95/46

(Continued)

FOREIGN PATENT DOCUMENTS

JP   61-105870   *   5/1986
JP   61-105870 A   *   5/1986
(Continued)

OTHER PUBLICATIONS

Notice of Allowance in Korean Patent Application No. 10-2015-0056186, issued by the Republic of Korea;(cited with the original document and full text translation) May 24, 2016.

(Continued)

*Primary Examiner* — Dale E Page
*Assistant Examiner* — Quovaunda V Jefferson
(74) *Attorney, Agent, or Firm* — Heslin Rothenberg Farley & Mesiti P.C.; George S. Blasiak

(57) ABSTRACT

Disclosed is a method of manufacturing an a-IGZO TFT-based transient semiconductor. The method includes (a) stacking a thermal oxide layer on a silicon substrate and depositing a nickel thin layer; (b) forming a PECVD layer on the nickel thin layer; (c) patterning the PECVD layer after setting a gate area and depositing a metallic layer; (d) lifting off the metallic layer to form a gage metallic thin layer and depositing a gage insulating layer on the gate metallic thin layer; (e) depositing an a-IGZO layer on the gate insulating layer; (f) etching an active area and the gate insulating layer; (g) forming a source electrode and a drain electrode and attaching a thermal release tape on the source electrode and the drain electrode; (h) delaminating the nickel thin layer; (i) performing transcription on a polyvinyl alcohol thin layer after etching the nickel thin layer; and (j) detaching the tape.

20 Claims, 16 Drawing Sheets

(51) Int. Cl.
  *H01L 27/12* (2006.01)
  *H01L 29/66* (2006.01)
(52) U.S. Cl.
  CPC .. *H01L 29/66969* (2013.01); *H01L 29/78618* (2013.01); *H01L 29/78696* (2013.01)
(58) Field of Classification Search
  USPC .................................................. 438/455, 458
  See application file for complete search history.

(56) References Cited

U.S. PATENT DOCUMENTS

| | | | | |
|---|---|---|---|---|
| 6,423,465 | B1* | 7/2002 | Hawker | G03F 7/0392 |
| | | | | 430/203 |
| 6,756,285 | B1* | 6/2004 | Moriceau | B81C 1/00666 |
| | | | | 257/E21.087 |
| 6,814,832 | B2* | 11/2004 | Utsunomiya | H01L 21/2007 |
| | | | | 156/230 |
| 7,183,137 | B2* | 2/2007 | Lee | H01L 21/78 |
| | | | | 257/E21.599 |
| 2001/0017371 | A1* | 8/2001 | Tanaka | G02F 1/133345 |
| | | | | 257/59 |
| 2006/0063351 | A1* | 3/2006 | Jain | G02F 1/1362 |
| | | | | 438/455 |
| 2007/0072439 | A1* | 3/2007 | Akimoto | H01L 27/1225 |
| | | | | 438/795 |
| 2013/0241090 | A1* | 9/2013 | Sakamoto | G02B 1/118 |
| | | | | 264/1.7 |
| 2013/0273337 | A1* | 10/2013 | Yu | A61L 27/50 |
| | | | | 428/195.1 |

FOREIGN PATENT DOCUMENTS

| | | |
|---|---|---|
| KR | 10-2010-0120295 A1 | 11/2010 |
| KR | 10-2010-0132781 A | 12/2010 |
| KR | 10-2010-0137376 A1 | 12/2010 |
| KR | 1020100137376 A | 12/2010 |
| KR | 10-2014-0076471 A | 6/2014 |
| KR | 10-2015-0028997 A | 3/2015 |

OTHER PUBLICATIONS

Written Opinion in Korean Patent Application No. 10-2015-0056186, issued by the Republic of Korea; (cited with the original document and full text translation) May 4, 2016.

* cited by examiner

Transfer(or output) characteristics (ELED a-IGZO inverter)

(ROs characteristics)

(dissolution of Zn oxide)　　(dissolution of Ga oxide)　　(dissolution of In oxide)

(Zn, Ga, and In in the D.I. water)   (Average density)   (Zn, Ga, and In in the Bovine serum)

though 400° C., there may be a great possibility that the IGZO-based TFT is applied to an ultraviolet sensor or a gas (for example, $NO_2$) sensor.

METHOD OF MANUFACTURING AMORPHOUS IGZO TFT-BASED TRANSIENT SEMICONDUCTOR

CROSS-REFERENCE TO RELATED APPLICATION

This application claims priority to Korean Patent Application No. 10-2015-0056186 filed on Apr. 21, 2015, and all the benefits accruing therefrom under 35 U.S.C. § 119, the contents of which is incorporated by reference in its entirety.

BACKGROUND OF THE INVENTION

1. Field of the Invention

The present invention relates to a method of manufacturing a semiconductor, and more particularly to a method of manufacturing an amorphous indium gallium zinc oxide (IGZO) TFT-based transient semiconductor which transcribes a polyvinyl alcohol thin film having a predetermined molecular weight on a silicon and nickel-based carrier substrate stable at a high temperature to manufacture transient amorphous IGZO by using an amorphous IGZO TFT platform which is commercially produced.

2. Description of the Related Art

In these days, display industry has been grown through rapid technical development and has greatly contributed to make our living to be convenient and abundant and has been helping them to navigate more easily through the sea of massive information. The display technology has evolved from past Cathode The display market has rapidly progressed from the previous cathode ray tube (CRT) to the current liquid crystal display (LCD) and the organic lighting emission diode (OLED) which will be expected as next generation technology.

Since it is difficult to implement a high resolution display such as an ultra-high definition display and a flexible and transparent display with a previous a-Si: H based device due to the characteristics thereof, as a technique replacing the a-Si: H based device, an amorphous IGZO TFT technique was on the rise.

In general, when the IGZO, which is an amorphous oxidation semiconductor including a compound of In, Ga and Zn, is applied to a display product, it is possible to produce a high-resolution display having a higher resolution than that of amorphous silicon applied to a TFT LCD.

That is, because the previous LCD is required to be periodically refreshed even though a photo is displayed thereof, the LCD consumes additional Power. However, in case of IGZO, since the electric leakage is small, the number of refreshment may be reduced as compared with that of the previous LCD.

Thus, the power consumed to display a still image such as a photo may be reduced and the power consumption may be greatly reduced as compared with that of a previous LCD-type display.

In addition, since the electron mobility of IGZO is 20~50 times of that of amorphous silicon so that it is possible to miniaturize a TFT circuit, a circuit having a higher aperture ratio and high performance may be mounted on a panel so that the panel may be simplified and higher value-added.

In addition, since the IGZO-based TFT has an optical bandgap of about 3 eV and may maintain an amorphous structure at about 400° C., there may be a great possibility that the IGZO-based TFT is applied to an ultraviolet sensor or a gas (for example, $NO_2$) sensor.

In addition, as another interest of the IGZO, specifically, the IGZO is bio-compatible and bio-dissolvable.

As an evidence to support above, there is a Gallois material used as a prosthetic material and approved by U.S. FDA, which is based on indium oxide and gallium oxide that are core materials of the IGZO.

In addition, it has been known in the art through many studies that ZnO is bio-compatible and bio-dissolvable.

Based on the facts above, the a-IGZO-based TFT constituted based on gallium, oxide film, indium, indium oxide film and zinc presents the applicability of transient electronics which has the concept that it temporarily operates and is extinguished after a desired function is completed.

Therefore, there is an attention to the IGZO when selecting a material for transient electronics because the IGZO has an excellent electric property and is based on a material approved by FDA in terms of bio-applicability. On the contrary, the Gallois material does not make great success as a prosthetic material because the Gallois material has a fatal problem in terms of reliability of gradually dissolving and disappearing in a body.

As described above, it is known that the reliability problem of Gallois contrarily gives a change to transient electronics in which a material must temporarily operate and must be dissolved to disappear.

However, a process of manufacturing amorphous IGZO, which has possibility in a transient electronics application, according to the related art is not matched to the processes of devices implemented in transient electronics.

For example, the amorphous IGZO TFT process requires a plasma enhanced chemical Vapor deposition (PECVD) process and a lithographic process, but a bio degradable substrate cannot endure a process temperature of 300° C. required in a conventional semiconductor process and a wet process.

Thus, to solve the problems of the a-IGZO TFT process of the related art, the present inventor has invented a method of manufacturing an amorphous IGZO TFT-based transient semiconductor which is capable of implementing IGZO TFT and a circuit on a Si and Ni-based carrier substrate stable at a high temperature by utilizing an amorphous IGZO TFT platform which is commercially produced.

As patent documents for prior arts, there are KR 10-2010-0120295 A1 and KR 10-2010-0137376 A1.

SUMMARY OF THE INVENTION

An object of the present invention is to provide a method of manufacturing an amorphous IGZO TFT-based transient semiconductor, which manufactures transient amorphous IGZO bio-compatible and bio-dissolvable by transcribing a silicon and nickel-based amorphous IGZO TFT stable at a high temperature by using a polyvinyl alcohol thin film having a predetermined molecular weight.

The objects of the present invention are not limited to the above-mentioned objects, and other objects will be clearly understood from the following description by those skilled in the art.

In order to accomplish the above objects, there is provided a method of manufacturing an amorphous IGZO TFT-based transient semiconductor, which includes: (a) stacking a thermal oxide layer on a silicon substrate and depositing a nickel thin layer on the thermal oxide layer; (b) forming a plasma enhanced chemical vapor deposition layer on the nickel thin layer; (c) setting and patterning a gate area on the plasma enhanced chemical vapor deposition layer and depositing a metallic layer; (d) lifting off the metallic layer to form a gate metallic thin layer and depositing a gate insulating layer on the gate metallic thin layer; (e) depositing an amorphous IGZO layer on the gate insulating layer through sputtering; (f) etching an active area and the gate insulating layer of the amorphous IGZO layer; (g) forming a source electrode and a drain electrode on the amorphous IGZO layer and attaching a thermal release tape on the source electrode and the drain electrode; (h) delaminating the nickel thin layer using deionized water; (i) performing transcription on a polyvinyl alcohol thin layer after etching the nickel thin layer and washing the substrate; and (j) delaminating the thermal release tape by placing the substrate on a thermal plate.

The nickel thin layer is deposited through e-gun evaporation or sputtering.

The nickel thin layer has a thickness in a range of 250 nm to 350 nm.

The attaching of the thermal release tape includes forming a via hole through the gate insulating layer through reactive ion etching; forming the source and drain electrodes through electron beam deposition, photolithography and lift-off processes; and performing an annealing process at a predetermined temperature.

The source and drain electrodes include a molybdenum or tungsten layer.

The source and drain electrodes have thicknesses in a range of 60 nm to 80 nm.

The gate metallic thin layer is formed by performing reverse-etching for the metallic layer instead of lifting off the metallic layer.

The depositing of the amorphous IGZO layer on the gate insulating layer through the sputtering is performed in an Ar atmosphere under pressure of 3 mtorr to 7 mtorr at a room temperature in a state that a molar ratio of a sputtering target is $Ga_2O_3:In_2O_3:ZnO=1:1:1$ mole %.

The polyvinyl alcohol thin layer includes polyvinyl alcohol having a molecular weight in a range of 10,000 to 31,000.

The polyvinyl alcohol thin layer is formed by: dissolving the polyvinyl alcohol having the molecular weight in pure deionized water; cooling a solution having the dissolved polyvinyl alcohol to a room temperature to extract the solution; containing the extracted solution to a predetermined initial height in a plastic container; removing bubbles from the solution having the dissolved polyvinyl alcohol through pumping after placing the plastic container into a vacuum container; and removing moisture from a bubble-removed polyvinyl alcohol solution using a convection oven or a thermal plate.

The convection oven or the thermal plate has a temperature in a range of 50° C. to 80° C.

The dissolution of the transient semiconductor is measured by using deionized water or bovine serum.

The transcription is performed using one of poly lacticcoglycolic acid, copolymer of poly lactic acid, poly glycolic acid, and polycaprolactone instead of polyvinyl alcohol.

Details of other embodiments are included in the detailed description and accompanying drawings.

The advantages, the features, and schemes of achieving the advantages and features of the present invention will be apparently comprehended by those skilled in the art based on the embodiments, which are detailed later in detail, together with accompanying drawings. The present invention is not limited to the following embodiments but includes various applications and modifications. The embodiments will make the disclosure of the present invention complete, and allow those skilled in the art to completely comprehend the scope of the present invention. The present invention is only defined within the scope of accompanying claims.

According to the present invention, an amorphous IGZO TFT-based transient semiconductor which is capable of implementing IGZO TFT and a circuit thereof may implemented on a Si and Ni-based carrier substrate stable at a high temperature by utilizing an amorphous IGZO TFT platform which is commercially produced, so that the limitation of a bio-degradable substrate which cannot endure a process temperature required in a conventional semiconductor process and a wet process can be overcome.

DETAILED DESCRIPTION OF THE INVENTION

Hereinafter, an exemplary embodiment of the present invention will be described in detail with reference to accompanying drawings.

The terminology and words used herein and accompanying claims should be not interpreted as the meanings of commonly used dictionaries, but interpreted as having meanings according to the technical sprit of the present invention on the principle that the concepts of the terminology and the words can be defined by the inventor in order to explain the present invention in the best mode.

Throughout the whole specification, when a predetermined part "includes" a predetermined component, the predetermined part does not exclude other components, but may further include other components unless the context clearly indicates otherwise. In addition, the terms "part", "machine", "module", "device", or "step" refer to units to process at least one function or operation, and is realized by hardware or software, or the combination of the hardware and the software.

Figure 1:
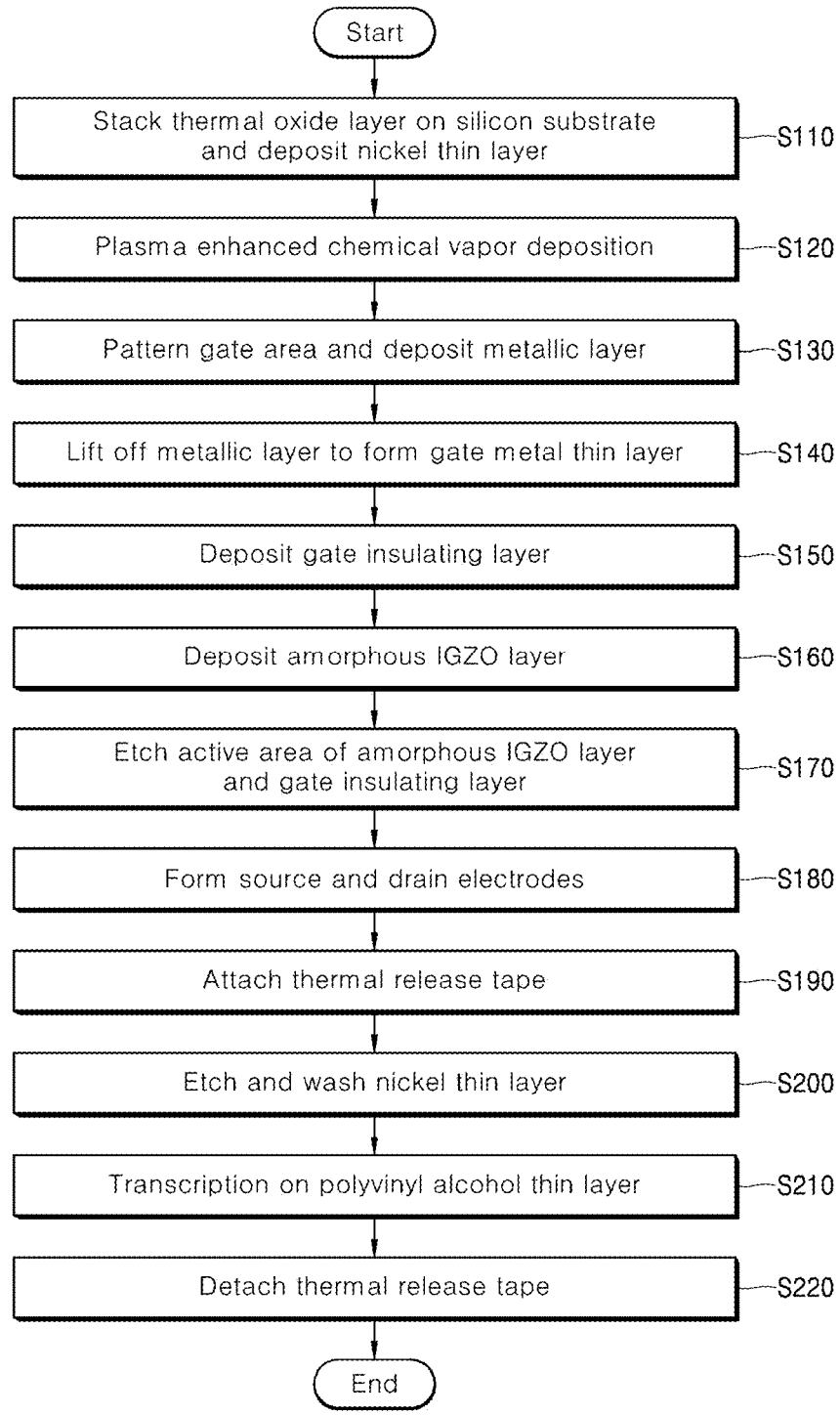
FIG. 1 is a flowchart illustrating a method of manufacturing an amorphous IGZO TFT-based transient semiconductor according to an embodiment of the present invention.

FIG. 1 is a flowchart illustrating a method of manufacturing an amorphous IGZO TFT-based transient semiconductor according to an embodiment of the present invention.

Figure 2:
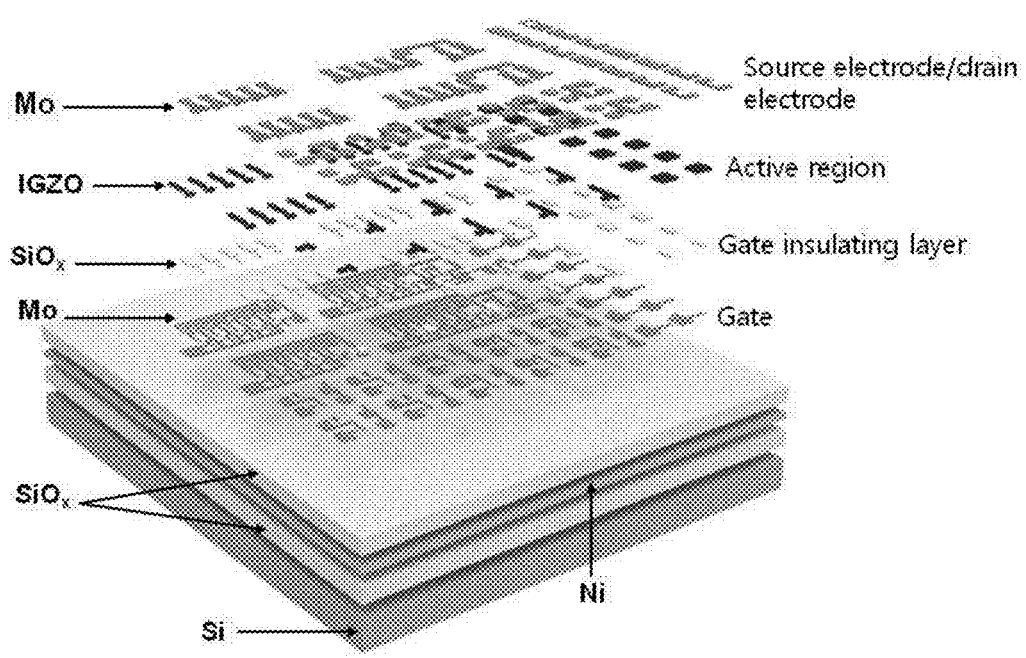
FIG. 2 is a perspective view illustrating an amorphous IGZO TFT-based transient semiconductor manufactured according to the manufacturing method illustrated in FIG. 1.

FIG. 2 is a perspective view illustrating an amorphous IGZO TFT-based transient semiconductor manufactured according to the manufacturing method illustrated in FIG. 1.

With reference to FIGS. 1 and 2, a method of manufacturing an amorphous IGZO TFT-based transient semiconductor according to an embodiment of the present invention will be described as follows.

Referring to FIGS. 1 and 2, a thermal oxide layer is stacked on a silicon substrate, where a thickness of the thermal oxide layer may be set to be in the range of 250 nm to 350 nm, preferably, 300 nm.

In step S110, a nickel thin layer is deposited on the thermal oxide layer through an e-gun evaporation or sputtering scheme. A thickness of the nickel thin layer may be set to be in the range of 250 nm to 350 nm, preferably, 300 nm.

In step S120, oxide silicon (SiOx) or silicon nitride is deposited on the nickel thin layer at 300° C. through a PECVD process scheme to form a PECVD layer to have a thickness in the range of 100 nm to 300 nm.

The PECVD process scheme is a thin layer composition method which forms plasma in a reaction chamber to easily cause the react and help the deposition.

A desired gate area is set on the PECVD layer with photo-resistor to pattern the gate area through wet etching.

In this case, the wet etching is performed for 5 seconds, where the ratio between deionized water and hydrochloric acid is 30:1.

After metal such as Mo or W is deposited to form a metallic layer in step S130, a gate metal thin layer is formed by lifting off or back etching the metal layer of Mo or W in step S140.

In step S150, a PECVD gate insulating layer (for example, $SiO_x$ or $Si_xN_y$) is deposited on the gate metal thin layer.

A thickness of the gate insulating layer may be set in the range of 40 nm to 60 nm, preferably 50 nm.

In step S160, an a-IGZO layer, which is an oxide semiconductor, is deposited on the gate insulating layer through an RF sputtering process or a solution process.

In this case, a molar ratio of the sputtering target is $Ga_2O_3:In_2O_3:ZnO=1:1:1$ mole % and the deposition is performed in an Ar atmosphere under the pressure of 3 mtorr to 7 mtorr, preferably, 5 mtorr with power of 50 W at the room temperature for 30 minutes.

Figure 3:
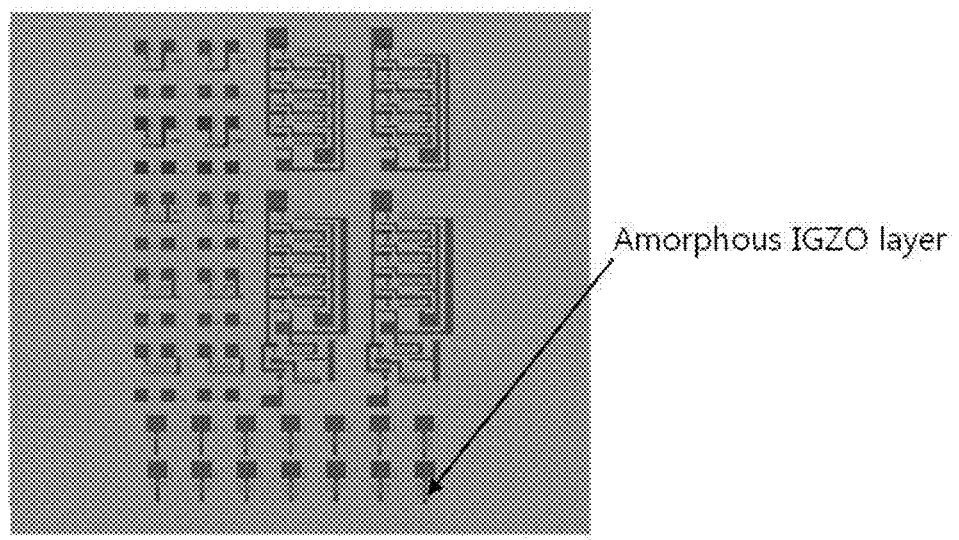
FIG. 3 is a plan view showing a state that an active area on an amorphous IGZO layer sequentially formed according to the manufacturing method illustrated in FIG. 1 is etched.

FIG. 3 is a plan view showing a state that an active area on an amorphous IGZO layer sequentially formed according to the manufacturing method illustrated in FIG. 1 is etched.

Figure 4:
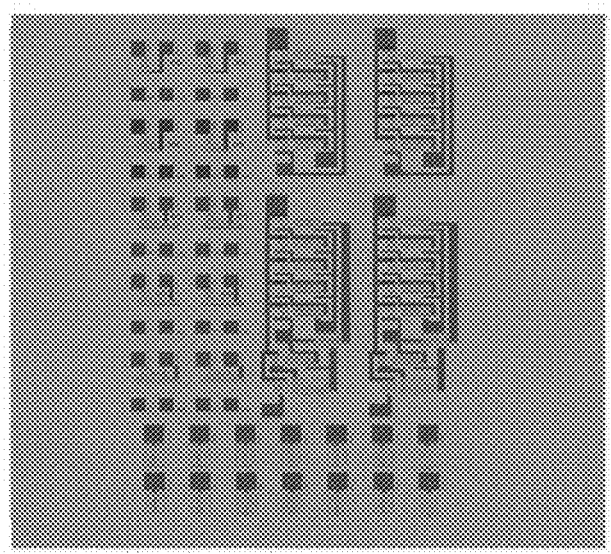
FIG. 4 is a plan view showing a state that a gate insulating layer sequentially formed according to the manufacturing method illustrated in FIG. 1 is etched.

FIG. 4 is a plan view showing a state that a gate insulating layer sequentially formed according to the manufacturing method illustrated in FIG. 1 is etched.

Figure 5:
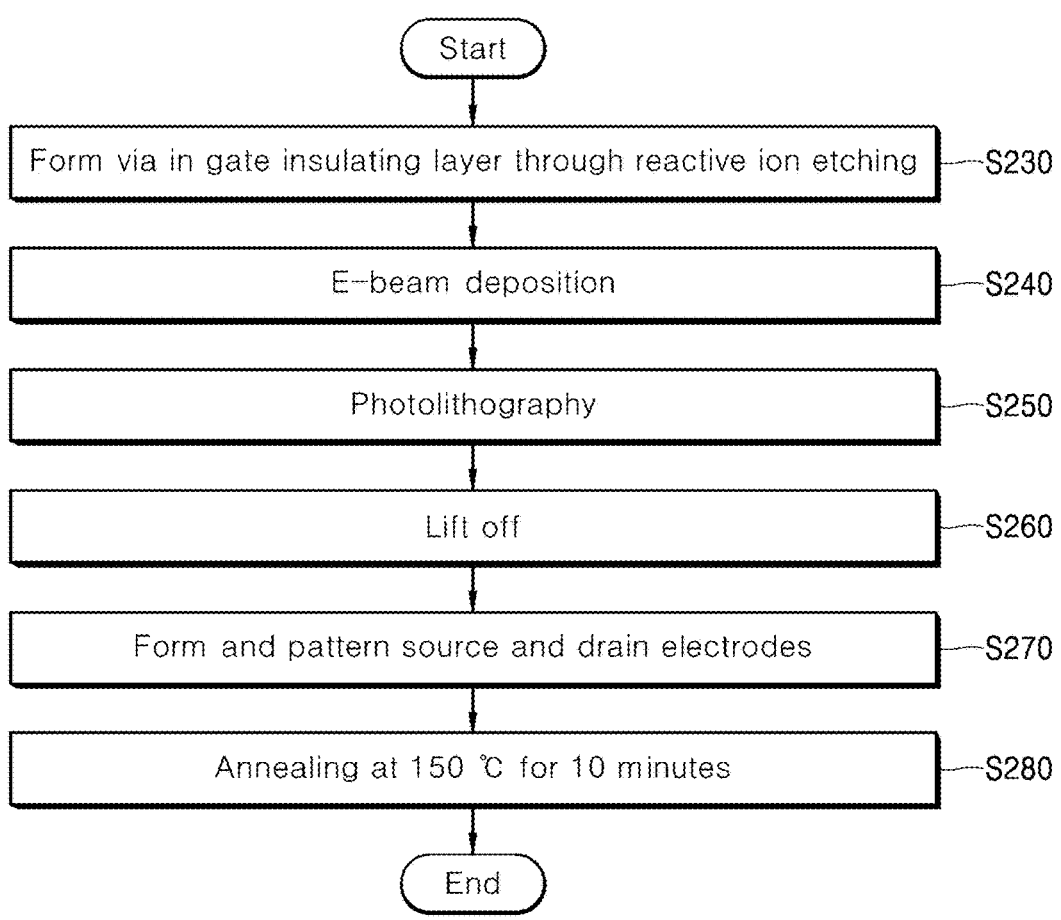
FIG. 5 is a flowchart illustrating steps of forming source and drain electrodes in the method of manufacturing an amorphous IGZO TFT-based transient semiconductor according to an embodiment of the present invention.

FIG. 5 is a flowchart illustrating steps of forming source and drain electrodes in the method of manufacturing an amorphous IGZO TFT-based transient semiconductor according to an embodiment of the present invention.

Figure 6:
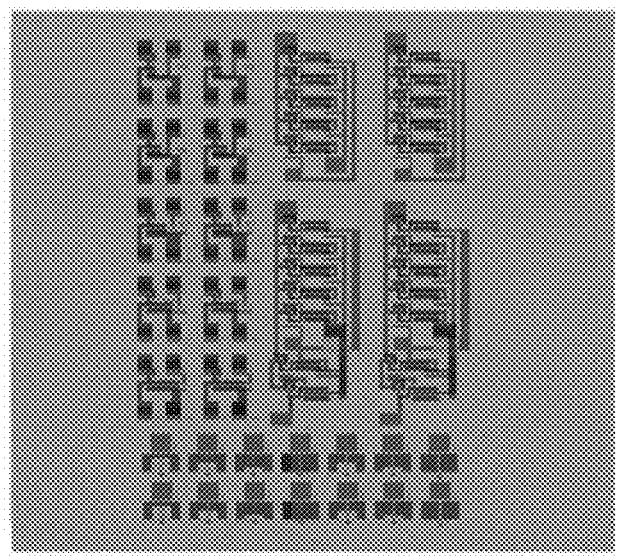
FIG. 6 is a plan view illustrating a circuit formed according to the manufacturing method illustrated in FIG. 1.

FIG. 6 is a plan view illustrating a circuit formed according to the manufacturing method illustrated in FIG. 1.

Figure 7:
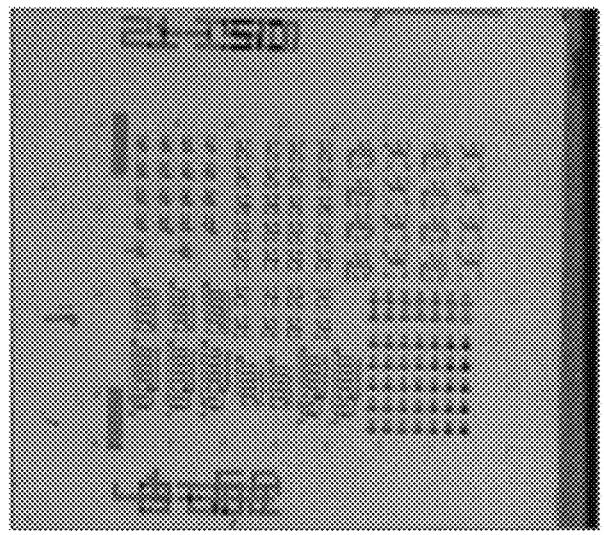
FIG. 7 is a plan view illustrating a circuit sequentially formed on a silicon substrate according to the manufacturing method illustrated in FIG. 1.

FIG. 7 is a plan view illustrating a circuit sequentially formed on a silicon substrate according to the manufacturing method illustrated in FIG. 1.

Figure 8:
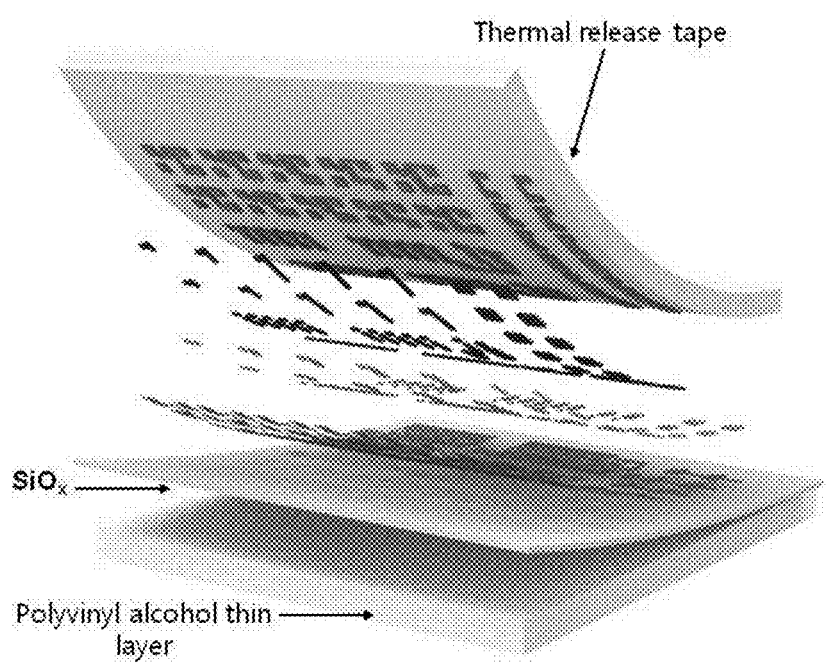
FIG. 8 is a perspective view illustrating an amorphous IGZO TFT-based transient semiconductor to which a thermal release tape is sequentially attached according to the manufacturing method illustrated in FIG. 1.

FIG. 8 is a perspective view illustrating an amorphous IGZO TFT-based transient semiconductor to which a thermal release tape is sequentially attached according to the manufacturing method illustrated in FIG. 1.

Figure 9:
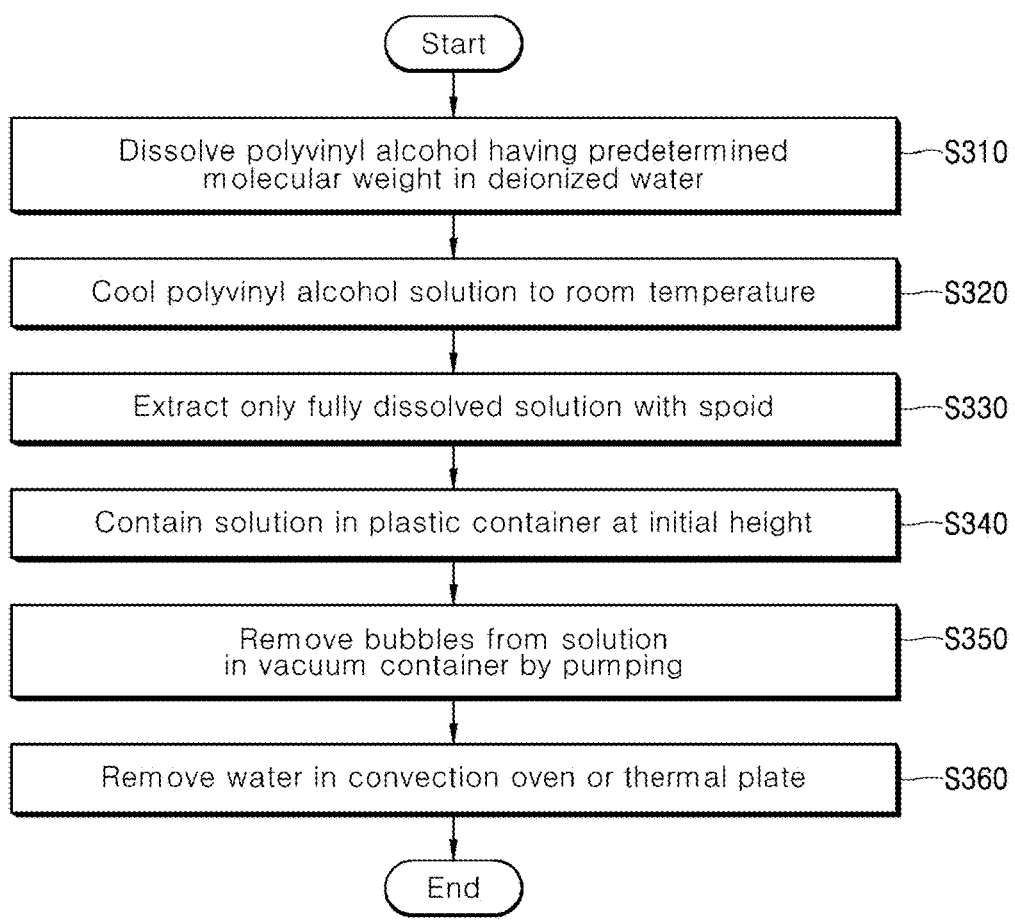
FIG. 9 is a flowchart illustrating a step of manufacturing forming a polyvinyl alcohol thin layer in the method of manufacturing an amorphous IGZO TFT-based transient semiconductor according to an embodiment of the present invention.

FIG. 9 is a flowchart illustrating a step of manufacturing forming a polyvinyl alcohol thin layer in the method of manufacturing an amorphous IGZO TFT-based transient semiconductor according to an embodiment of the present invention.

Figure 10:
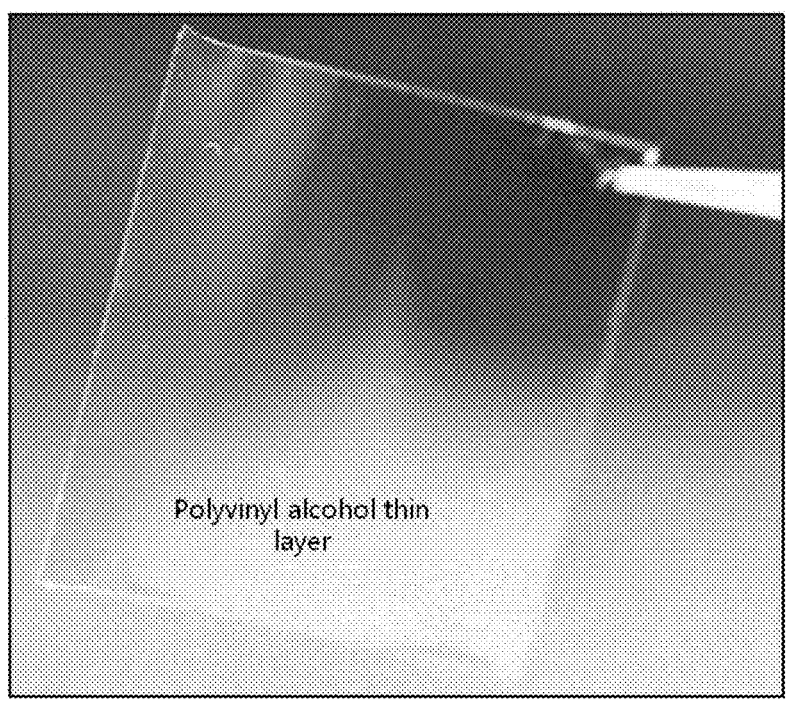
FIG. 10 is a photograph of the polyvinyl alcohol thin layer manufactured according to the manufacturing method illustrated in FIG. 9.

FIG. 10 is a photograph of the polyvinyl alcohol thin layer manufactured according to the manufacturing method illustrated in FIG. 9.

Figure 11:
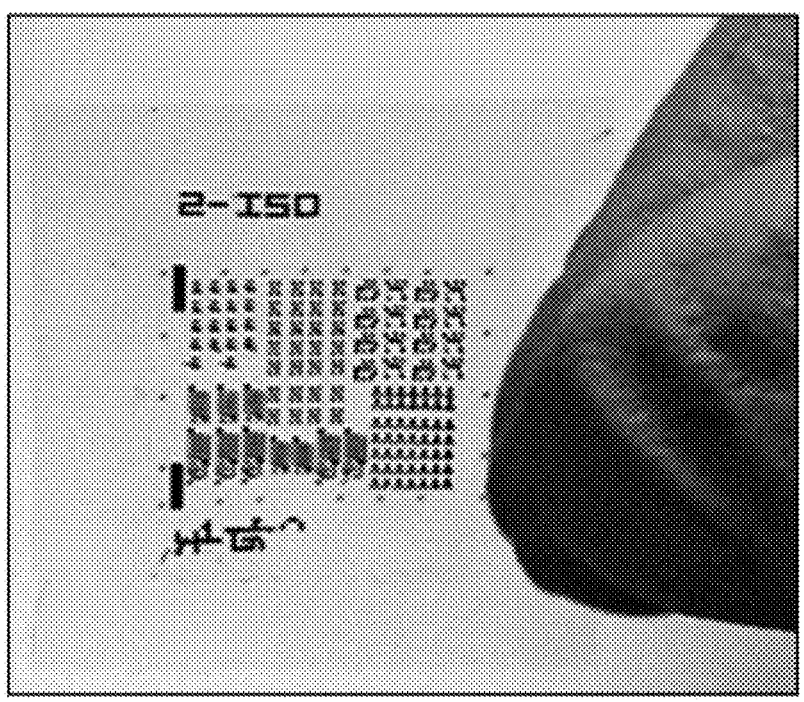
FIG. 11 is a photograph of transient amorphous IGZO finally formed according to the manufacturing method illustrated in FIG. 1.

FIG. 11 is a photograph of transient amorphous IGZO finally formed according to the manufacturing method illustrated in FIG. 1.

As shown in FIGS. 1 and 3, the a-IGZO layer of the desired active area is selectively formed by utilizing wet or dry etching in step S170.

In this case, the wet etching is performed at the ratio between deionized water and hydrochloric acid is 30:1.

As shown in FIG. 4, the gate insulating layer is selectively removed through wet or dry etching.

As shown in FIGS. 5 and 6, through electron beam deposition, photolithography and acetone-on lift-off processes (S240 and S250), a molybdenum or tungsten layer, which serves as the source and drain electrodes, is formed at a thickness in the range of 60 nm to 80 nm, preferably, 70 nm (S180), patterned (S270), and subject to an annealing process at the temperature of 150° C. for 10 minutes (S280) to form the final device and circuit as shown in FIG. 7.

In this case, the patterning of the source and drain electrodes is performed after a via passing through the gate insulating layer is formed through $O_2/CF_4$ reactive ion etching (RIE) in step S230.

As shown in FIGS. 1 and 8, after a thermal release tape is attached to the finally formed device in step S190, the nickel thin layer formed on the silicon substrate is delaminated in deionized water.

After the nickel thin layer is etched and washed in deionized water in step S200, the nickel thin layer is transcribed on the polyvinyl alcohol (PVA) thin layer in step S210.

Although the polyvinyl alcohol is used in the embodiment, poly lacticco-glycolic acid (PLGA), copolymer of poly lactic acid (PLA), poly glycolic acid (PGA), or polycaprolactone (PCL) may be used instead of the polyvinyl alcohol.

In this case, the polyvinyl alcohol having a molecular weight in a range of 10,000 to 31,000 and a thickness in the range of 15 nm to 25 nm, preferably, 20 nm is used.

When the molecular weight of the polyvinyl alcohol is 31,000 or more, the polyvinyl alcohol is harmful to the human body due to the toxicity.

The method of manufacturing the polyvinyl alcohol thin layer with the polyvinyl alcohol having the above-described molecular weight is as follows.

As shown in FIG. 9, in step S310, the polyvinyl alcohol is dissolved in pure deionized water to prepare solution having concentration of 10 wt %.

That is, in state that the solution in a glass container such as a beaker is maintained at a temperature of 60° C. to 70° C. while being stirred with a magnetic bar, the polyvinyl alcohol are sufficiently dissolved for at least 12 hours.

In this case, to prevent deionized water from evaporating, the polyvinyl alcohol is dissolved while being covered with aluminum foil or a glass lid and ventilated at a minimum.

After the dissolved polyvinyl alcohol solution is cooled in air in step S320, only the fully dissolved transparent solution is extracted with a spoid in step S330.

The extracted solution is contained in a plastic container having a flat bottom or an SUS-based container to have an initial height of 1 mm to 5 mm in step S340.

The thickness of the finally formed polyvinyl alcohol thin layer is controlled in the range of several μm to several hundred μm according to the initial height of the solution.

In step S350, bubbles are removed from the dissolved polyvinyl alcohol solution through vacuum pumping after placing the plastic container containing the polyvinyl alcohol solution into a vacuum container If the above-described steps are not performed, a pinhole is generated in the polyvinyl alcohol thin layer so that it is impossible to form a uniform polyvinyl alcohol thin layer.

Then, in step S360, the plastic container containing the evenly maintained polyvinyl alcohol is kept in a convection oven or a thermal plate at a temperature 50° C. to 80° such that water is removed from the polyvinyl alcohol thin layer.

When the temperature is lower than 50° C., it takes too long a time to form the polyvinyl alcohol thin layer and a wrinkle is generated on the finally formed polyvinyl alcohol thin layer, so that it is difficult to achieve a desired flatness. When the temperature is higher than 80° C., the thickness of the formed polyvinyl alcohol thin layer is not uniform or a serious wrinkle is generated on the formed polyvinyl alcohol thin layer.

Thereafter, in step S220, the semiconductor is placed on a hot plate such that the thermal release tape is detached from the semiconductor.

When the silicon and nickel-based a-IGZO thin transistor (TFT) of is transcribed into the polyvinyl alcohol thin layer of FIG. 10, the transient a-IGZO is finally formed as shown in FIG. 11.

Next, the transfer characteristics of the transient semiconductor manufactured by the method of manufacturing an amorphous IGZO TFT-based transient semiconductor according to the present invention will be described.

Figure 12:
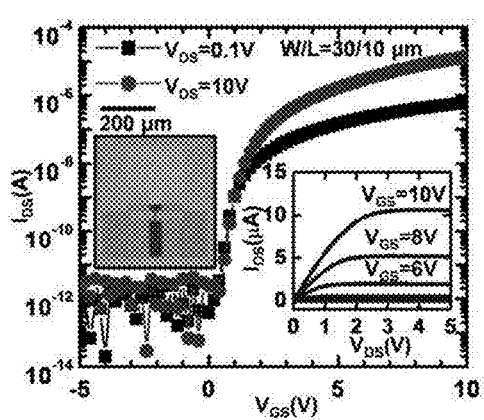
FIG. 12 is a circuit diagram illustrating the transfer characteristics of an amorphous IGZO TFT-based transient semiconductor formed according to the manufacturing method illustrated in FIG. 1.
Figure 12:
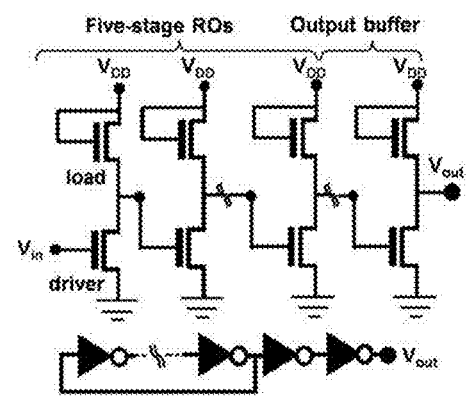

FIG. 12 is a circuit diagram illustrating the transfer characteristics of an amorphous IGZO TFT-based transient semiconductor formed according to the manufacturing method illustrated in FIG. 1.

Figure 13:
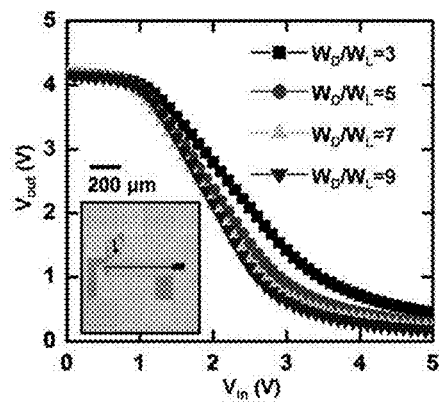
FIG. 13 is a graph illustrating the electrical properties of an inverter and an oscillator manufactured of an amorphous IGZO TFT-based transient semiconductor formed according to the manufacturing method illustrated in FIG. 1.
Figure 13:
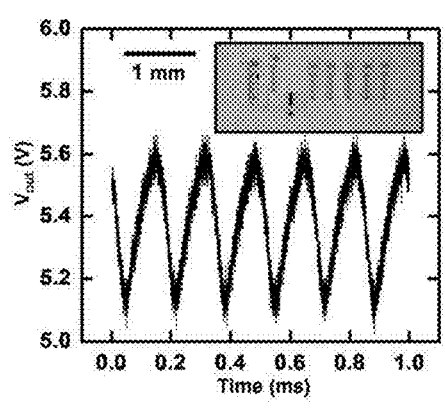

FIG. 13 is a graph illustrating the electrical properties of an inverter and an oscillator manufactured of an amorphous IGZO TFT-based transient semiconductor formed according to the manufacturing method illustrated in FIG. 1.

As shown in FIG. 12, in a linear region, the I-V curve shows that, similarly with those of a conventional IGZO, the on/off ratio is quantitatively a degree of $2\times10^6$ and the mobility is 8 to 10 $cm^2/Vs$.

To examine the possibility of implementing a circuit based on the above, a very simple form of a five-stage ring oscillator was constructed.

As shown in FIG. 13, when the inverter characteristics are examined in terms of design, it was known that, as a size of a driver is enlarged, the voltage gain is increased.

In addition, the resonant frequency is 5.67 kHz which is a degree predicted in theory. As compared with previous characteristics, it was confirmed that the resonant frequency is not substantially changed.

Next, dissolution kinetics of the transient semiconductor, which is manufactured by the method of manufacturing an amorphous IGZO TFT-based transient semiconductor according to the present invention, will be described in detail.

Figure 14:
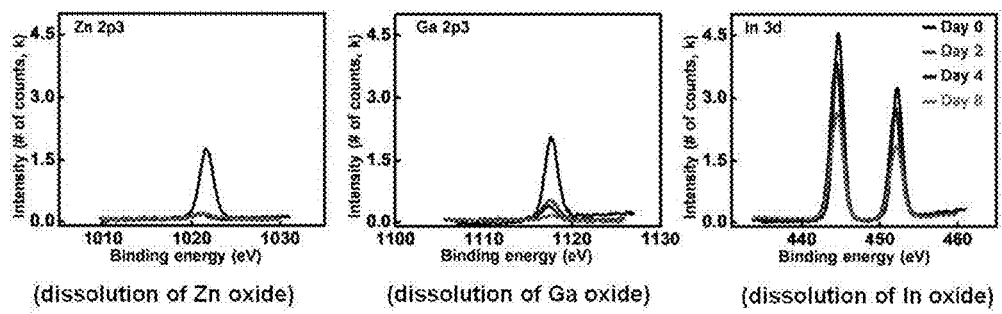
FIG. 14 is a graph illustrating solubility of each component of an amorphous IGZO layer in an amorphous IGZO TFT-based transient semiconductor formed according to the manufacturing method illustrated in FIG. 1.

FIG. 14 is a graph illustrating solubility of each component of an amorphous IGZO layer in an amorphous IGZO TFT-based transient semiconductor formed according to the manufacturing method illustrated in FIG. 1.

Figure 15:
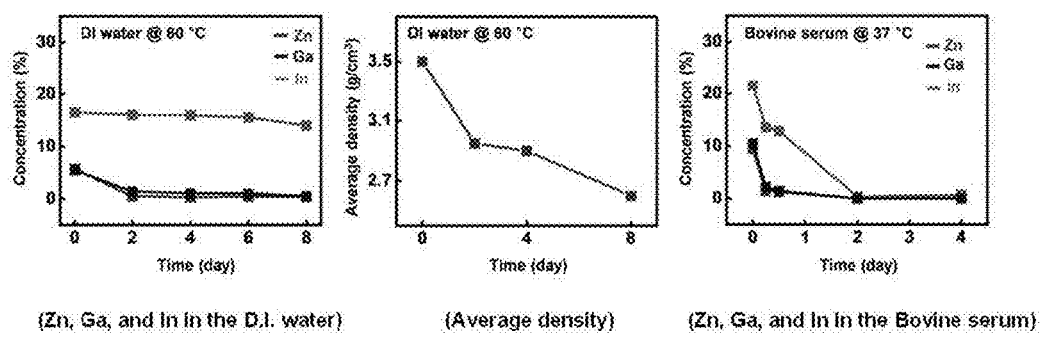
FIG. 15 is a graph illustrating the results of measuring solubility of each component of an amorphous IGZO layer in an amorphous IGZO TFT-based transient semiconductor formed according to the manufacturing method illustrated in FIG. 1 by using deionized water and bovine serum.

FIG. 15 is a graph illustrating the results of measuring solubility of each component of an amorphous IGZO layer in an amorphous IGZO TFT-based transient semiconductor formed according to the manufacturing method illustrated in FIG. 1 by using deionized water and bovine serum.

Figure 16:
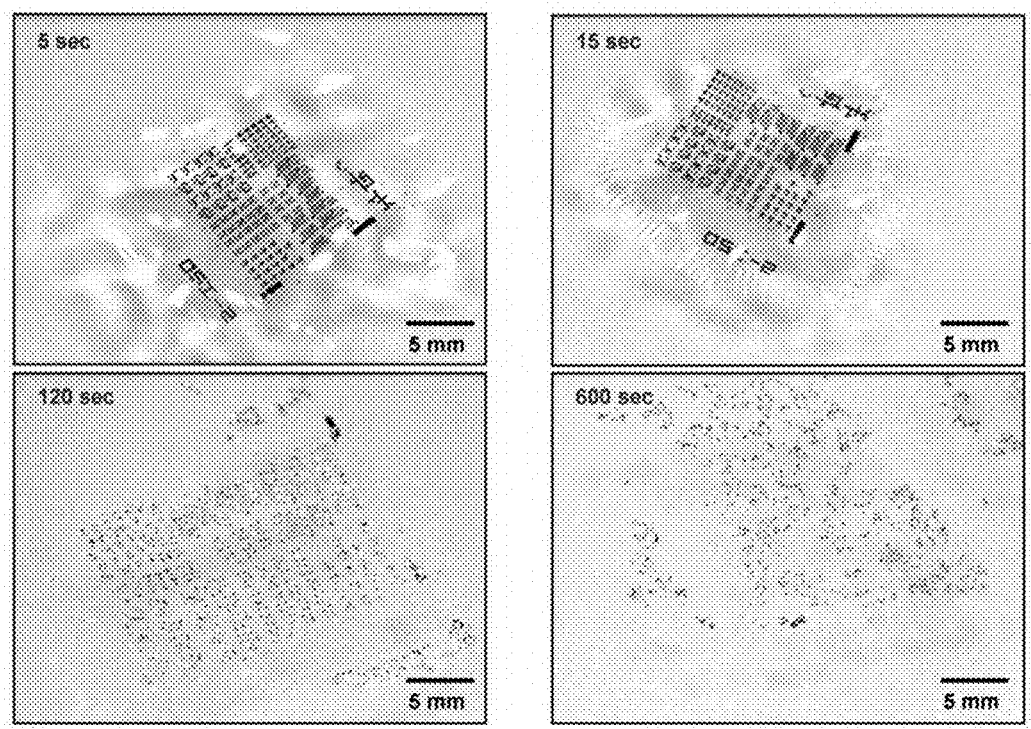
FIG. 16 is a photograph of real dissolution of an amorphous IGZO TFT-based transient semiconductor formed according to the manufacturing method illustrated in FIG. 1 over time.

FIG. 16 is a photograph of real dissolution of an amorphous IGZO TFT-based transient semiconductor formed according to the manufacturing method illustrated in FIG. 1 over time.

As shown in FIG. 14, it was known that Zn and Ga are rapidly dissolved over time and to the contrary, In is slowly dissolved.

It was known that, although the dissolution velocities of Zn, Ga and In through hydrolysis mechanism are different from each other, all of them are dissolved.

As shown in FIG. 15, to know indirectly whether the aspect of dissolution of solution similar to body fluid as well as the deionized water is bio-compatible, the experiment was performed using bovine serum.

As the experiment result, when Zn and Ga are compared with the deionized water, it was confirmed that the dissolution velocities of Zn and Ga are fast and In is most dissolved within two days.

It was determined that Cl ions among many ions included in the bovine serum, which are ions of HCL treated as etching solution of the a-IGZO, accelerate the dissolution velocity.

As shown in FIG. 16, as the experiment result, in the dissolution aspect of the a-IGZO TFT manufactured on the polyvinyl alcohol thin substrate, it was conformed that the a-IGZO TFT starts to be dissolved within 15 seconds, is rapidly dissolved within 120 seconds and fully dissolved within 600 seconds.

As described above, according to the present invention, there is provided a method of manufacturing an amorphous IGZO TFT-based transient semiconductor, which manufactures transient amorphous IGZO bio-compatible and bio-dissolvable by transcribing a silicon and nickel-based amorphous IGZO TFT stable at a high temperature by using a polyvinyl alcohol thin film having a predetermined molecular weight.

Thus, an amorphous IGZO TFT-based transient semiconductor which is capable of implementing IGZO TFT and a circuit thereof may implemented on a Si and Ni-based carrier substrate stable at a high temperature by utilizing an amorphous IGZO TFT platform which is commercially produced, so that the limitation of a bio-degradable substrate which cannot endure a process temperature required in a conventional semiconductor process and a wet process can be overcome.

Although a preferred embodiment of the present invention has been described for illustrative purposes, those skilled in the art will appreciate that various equivalents, modifications, additions and substitutions are possible, without departing from the scope and spirit of the invention as disclosed in the accompanying claims.

What is claimed is:

1. A method of manufacturing an amorphous IGZO TFT-based transient semiconductor, the method comprises:
    (a) stacking a thermal oxide layer on a silicon substrate and depositing a nickel thin layer on the thermal oxide layer;
    (b) forming a plasma enhanced chemical vapor deposition layer on the nickel thin layer;
    (c) setting and patterning a gate area on the plasma enhanced chemical vapor deposition layer and depositing a metallic layer;
    (d) lifting off the metallic layer to form a gate metallic thin layer and depositing a gate insulating layer on the gate metallic thin layer;
    (e) depositing an amorphous IGZO layer on the gate insulating layer through sputtering;
    (f) etching an active area and the gate insulating layer of the amorphous IGZO layer;
    (g) forming a source electrode and a drain electrode on the amorphous IGZO layer and attaching a thermal release tape on the source electrode and the drain electrode;
    (h) delaminating the nickel thin layer using deionized water;
    (i) performing transcription on a polyvinyl alcohol thin layer after etching the nickel thin layer and washing the etched nickel thin layer, wherein the polyvinyl alcohol thin layer is formed by extracting a polyvinyl alcohol solution dissolved in deionized water, placing the solution into a vacuum container and removing bubbles from the solution through pumping; and
    (j) delaminating the thermal release tape by placing the substrate on a thermal plate.

2. The method of claim 1, wherein the nickel thin layer is deposited through e-gun evaporation or sputtering.

3. The method of claim 1, wherein the nickel thin layer has a thickness in a range of 250 nm to 350 nm.

4. The method of claim 1, wherein the attaching of the thermal release tape comprises:
    forming a via hole through the gate insulating layer through reactive ion etching;
    forming the source and drain electrodes through electron beam deposition, photolithography and lift-off processes;
    attaching a thermal release tape on the source electrode and the drain electrode; and
    performing an annealing process at a predetermined temperature.

5. The method of claim 1, wherein the source and drain electrodes comprise a molybdenum or tungsten layer.

6. The method of claim 5, wherein the source and drain electrodes have thicknesses in a range of 60 nm to 80 nm.

7. The method of claim 1, wherein the gate metallic thin layer is formed by performing reverse-etching for the metallic layer instead of lifting off the metallic layer.

8. The method of claim 1, wherein the depositing of the amorphous IGZO layer on the gate insulating layer through the sputtering is performed in an Ar atmosphere under pressure of 3 mtorr to 7 mtorr at a room temperature in a state that a molar ratio of a sputtering target is $Ga_2O_3$:$In_2O_3$:$ZnO$=1:1:1 mole %.

9. The method of claim 1, wherein the polyvinyl alcohol thin layer includes polyvinyl alcohol having a molecular weight in a range of 10,000 to 31,000.

10. The method of claim 9, wherein the polyvinyl alcohol thin layer is formed by:
    dissolving the polyvinyl alcohol having the molecular weight in pure deionized water;
    cooling a solution having the dissolved polyvinyl alcohol to a room temperature to extract the solution;
    containing the extracted solution to a predetermined initial height in a plastic container;
    removing bubbles from the solution having the dissolved polyvinyl alcohol through pumping after placing the plastic container into the vacuum container; and
    removing moisture from a bubble-removed polyvinyl alcohol solution using a convection oven or a thermal plate.

11. The method of claim 10, wherein the convection oven or the thermal plate has a temperature in a range of 50° C. to 80° C.

12. The method of claim 1, wherein dissolution of the amorphous IGZO layer of the transient semiconductor is measured by using deionized water or bovine serum.

13. The method of claim 1, wherein the transcription is performed using one of poly lacticco-glycolic acid, copolymer of poly lactic acid, poly glycolic acid, and polycaprolactone instead of polyvinyl alcohol.

14. A method of manufacturing an amorphous IGZO TFT-based transient semiconductor, the method comprises:
    (a) stacking a thermal oxide layer on a silicon substrate and depositing a nickel thin layer on the thermal oxide layer;
    (b) forming a plasma enhanced chemical vapor deposition layer on the nickel thin layer;
    (c) setting and patterning a gate area on the plasma enhanced chemical vapor deposition layer and depositing a metallic layer;
    (d) lifting off the metallic layer to form a gate metallic thin layer and depositing a gate insulating layer on the gate metallic thin layer;
    (e) depositing an amorphous IGZO layer on the gate insulating layer through sputtering;
    (f) etching an active area and the gate insulating layer of the amorphous IGZO layer;
    (g) forming a source electrode and a drain electrode on the amorphous IGZO layer and attaching a thermal release tape on the source electrode and the drain electrode;
    (h) delaminating the nickel thin layer using deionized water;
    (i) performing transcription on a polyvinyl alcohol thin layer after etching the nickel thin layer and washing the etched nickel thin layer, wherein the polyvinyl alcohol thin layer is formed by extracting a polyvinyl alcohol solution dissolved in deionized water, placing the solution into a vacuum container and removing bubbles from the solution through pumping; and (j) delaminating the thermal release tape.

15. The method of claim 14, wherein the etching an active area includes etching the IGZO layer to selectively form the active area.

16. The method of claim 14, wherein the etching a gate insulating layer includes selectively removing the gate insulating layer by dry or wet etching.

17. The method of claim 14, wherein the method includes, prior to the forming a source electrode and a drain electrode on the amorphous IGZO layer, forming a via passing through the gate insulating layer using reactive ion etching (RIE).

18. The method of claim 14, wherein the etching a gate insulating layer includes selectively removing the gate insulating layer by dry or wet etching, wherein the method includes, prior to the forming a source electrode and a drain electrode on the amorphous IGZO layer, forming a via passing through the gate insulating layer using reactive ion etching (RIE), and wherein the etching an active area includes etching the IGZO layer to selectively form the active area.

19. The method of claim 14, wherein the polyvinyl alcohol thin layer is formed by:

dissolving the polyvinyl alcohol in pure deionized water, wherein the dissolving includes preventing the deionized water from evaporating during the dissolving;

cooling a solution having the dissolved polyvinyl alcohol to a room temperature to extract the solution;

containing the extracted solution to a predetermined initial height in a container;

removing bubbles from the solution having the dissolved polyvinyl alcohol through pumping after placing the container into the vacuum container; and removing water from a bubble-removed polyvinyl alcohol solution using a convection oven or a thermal plate.

20. The method of claim 14, wherein the polyvinyl alcohol thin layer is formed by removing water from a bubble-removed polyvinyl alcohol solution using a convection oven or a thermal plate.

* * * * *